United States Patent [19]
Kim

[11] Patent Number: 5,622,883
[45] Date of Patent: Apr. 22, 1997

[54] METHOD FOR MANUFACTURING SEMICONDUCTOR MEMORY DEVICE HAVING LANDING PAD

[75] Inventor: Jeong-Seok Kim, Suwon, Rep. of Korea

[73] Assignee: Samsung Electronics Co., Ltd., Suwon, Rep. of Korea

[21] Appl. No.: 550,481

[22] Filed: Oct. 30, 1995

[30] Foreign Application Priority Data

May 31, 1995 [KR] Rep. of Korea ............ 95-14346

[51] Int. Cl.$^6$ ............... H01L 21/70; H01L 27/00
[52] U.S. Cl. ............................... 438/396; 438/701
[58] Field of Search ............................ 437/919, 52, 47, 437/60

[56] References Cited

U.S. PATENT DOCUMENTS 4,857,141  8/1989  Abe et al. ..................... 437/238
5,026,666  6/1991  Hills et al. .................... 437/195
5,248,628  9/1993  Okabe et al. .................. 437/919
5,292,677  3/1994  Dennison ..................... 437/919

Primary Examiner—Jey Tsai

[57] ABSTRACT

In manufacturing a high-integrated semiconductor memory device, there is disclosed a method for forming a trophy-shaped landing pad to a contact hole with a high aspect ratio by using a multiple-step etching process. According to the present invention, a storage node landing pad is formed by the multiple-step etching process and in different profiles via different etching processes from a bit line landing pad, thereby preventing a stringer or a bridge phenomenon occurring between the landing pads. Moreover, the trophy-shaped landing pad is formed by the multiple-step etching process, thereby securing an enough alignment margin and facilitating the manufacturing of 1 Gbit-grade DRAM by lowering the aspect ratio.

6 Claims, 4 Drawing Sheets 5,622,883

METHOD FOR MANUFACTURING SEMICONDUCTOR MEMORY DEVICE HAVING LANDING PAD

BACKGROUND OF THE INVENTION

The present invention relates to a method for manufacturing a highly integrated semiconductor memory device. More particularly, the present invention relates to a method for manufacturing a semiconductor memory device provided with a trophy-shaped landing pad formed by a multiple-step etching process and a contact hole with a high aspect ratio.

The design rule for highly integrated memory devices reduces gradually from about a 1 mm level in the generation of 1 Mbit-grade dynamic random access memory ("DRAM") devices to about a 0.15 mm level in the generation of 1 Gbit-grade DRAM devices. Thus, a contact hole, which provides an electrical contact part with respect to the silicon layer, diminishes gradually in dimension. Furthermore, the aspect ratio of the contact hole tends to gradually increase in accordance with the use of three dimensional capacitor structures in the vertical direction. The decrease of the contact hole's diameter and its high aspect ratio impose a large burden on succeeding photolithography steps. If the photolithography is carried out without accurate alignment, the contact hole cannot be formed at a desired site. Also, in the case of a high aspect ratio, it is likely that the etching process of the contact hole will cease before the interlayer insulation film is entirely removed.

A conventional DRAM having a capacitor over bitline ("COB") structure will be explained as an example. With the decrease of a dimension of a buried contact ("BC") and an increase in the aspect ratio, a technique has been proposed for forming a stable BC by using a landing pad without performing the etching process of the BC to secure an alignment margin for the photolithography. This proposal was for a product using the 64M DRAM-grade design rule. In general, the technique uses a single process to simultaneously form a bit line landing pad for a connection to the bit line and a storage node landing pad for a connection to the storage node. This diminishes the required etching depth in the etching process at the time of forming the BC and secures the desired alignment margin in the etching process.

However, a gap between the landing pads diminishes to approximately 0.1 mm according to a further limitation of the design rule resulting from the increase of the degree of integration. This makes it substantially difficult to restrain the occurrence of a stringer or a bridge phenomenon. In order to restrain the stringer and the bridge phenomenon resulting from the limitation of the design rule, a method has been proposed in which only the landing pad for the bit line is chiefly formed and a BC for the storage node is directly connected to the active region of a semiconductor substrate by self-aligning.

FIG. 1 shows a DRAM cell equipped with the BC for the bit line formed on the landing pad and the BC for the storage node using self-alignment, according to the method described above. As shown in FIG. 1, the DRAM cell includes a transistor 2, a landing pad 13, a first interlayer insulation film 15, a bit line 17 connected to the landing pad 13 and passing through the first interlayer insulation film 15, a second interlayer insulation film 19, a second side wall spacer 21, and a storage node 23.

The transistor 2 includes a gate oxide film 3, a gate, an insulation film 9, a first side wall spacer 11, and a source/drain region (not shown). The gate oxide film 3 is formed on a semiconductor substrate 1. The gate is a polyside structure in which a polycrystalline silicon 5 doped with impurities and a silicide 7 are layered. The insulation film 9 acts to cap the gate. The source/drain region is formed on substrate 1 between the gate patterns.

The landing pad 13 is for a bit line formed between the gates of the transistor. The first interlayer insulation film 15 is formed on the whole surface of the resultant structure. The second interlayer insulation film 19 is also deposited on the whole surface of the resultant structure. The second side wall spacer 21 acts to protect the side wall of the contact hole passing through first and second interlayer insulation films 15 and 19. The storage node 23 is connected to the source/drain region of the transistor through the contact hole.

When a BC is formed for a 1 Gbit-grade DRAM by using the conventional method as described above, however, the etching process ceases before the interlayer insulation films 15 and 17 are removed. This happens because the aspect ratio must be six or more according to the design rules for the 1 Gbit-grade DRAM. As a result of this limitation, the contact hole is not opened perfectly. Also, the required alignment margin for the photolithography is not secured because no landing pad is provided between the BC for the storage node and the semiconductor substrate.

SUMMARY OF THE INVENTION

An object of the present invention is to provide a method for manufacturing a semiconductor device having a trophy-shaped landing pad which reduces a possibility of the occurrence of a stringer or bridge phenomenon, secures an enough alignment margin for a photolithography for forming a BC for a storage node, and diminishes an aspect ratio to make a contact hole for a storage node open perfectly.

To achieve the above object, a method for manufacturing a semiconductor device having a trophy-shaped storage electrode landing pad including the steps of forming a first interlayer insulation film over the surface of a semiconductor substrate on which a transistor and a bit line landing pad are formed, the first interlayer insulation film covering the bit line landing pad and a gate of the transistor; forming a trophy-shaped contact hole in the first interlayer insulation film; filling the contact hole with a first conductive material to form the trophy-shaped storage electrode landing pad; forming a bit line connected to the bit line landing pad; and forming a storage electrode connected to the storage electrode landing pad.

It is preferable that, of the two-step etching process for forming the trophy-shaped contact hole, the first step of the multiple-step etching process includes an isotopic etching process by a wet etching method and the second step of the multiple step etching process includes an anisotropic etching process by a dry etching method.

Also, an etching profile formed by the isotropic etching process of the first step preferably has a tapered hemisphere shape with a depth of about 500–1,500 Å and a diameter of about 2,500–4,000 Å.

According to one embodiment of the present invention, the bit line landing pad and the storage electrode landing pad are formed at different heights by different etching methods. This diminishes the possibility that stringer or bridge phenomenon will occur between landing pads, even in products having a very strict design rule such as 1 Gbit DRAM. In addition, this provides a sufficient alignment margin for the etching process, which is required for forming a contact hole. Thus, the contact hole can be stably formed without stopping the etching process.

BRIEF DESCRIPTION OF THE DRAWINGS

The above objects and advantages of the present invention will become more apparent by describing in detail a preferred embodiment thereof with reference to the attached drawings.

DETAILED DESCRIPTION OF A PREFERRED EMBODIMENT

With reference to the attached drawings, an embodiment of the present invention will be explained in detail below.

Figure 1:
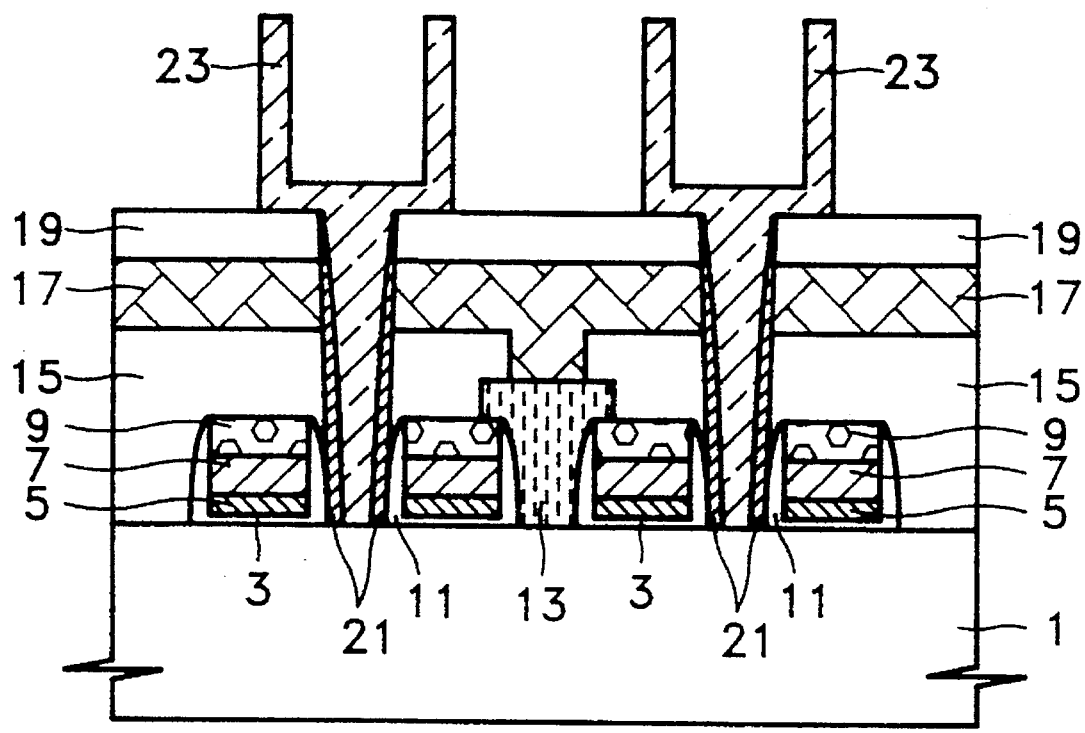
FIG. 1 is a cross-sectional view showing a DRAM cell having a bit line landing pad according to a conventional method.
Figure 2A:
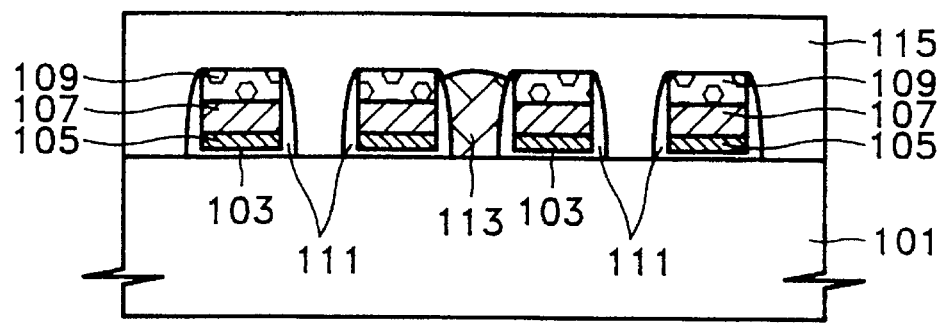
FIGS. 2A through 2G are cross-sectional views for sequentially showing a method for manufacturing a DRAM cell having a storage node landing pad according to a preferred embodiment of the present invention.

FIGS. 2A through 2G are cross-sectional views for sequentially showing a method for manufacturing a DRAM cell having a storage node landing pad according to a preferred embodiment of the present invention. FIG. 2A shows the step of depositing a first interlayer insulation film 115 on the whole surface of a semiconductor substrate 101 on which a transistor and a bit line landing pad are formed.

The transistor includes a gate oxide film 103, a gate, an insulation film 109, a first side wall spacer 111, and a source/drain region (not shown). The gate oxide film 103 is formed on a semiconductor substrate 101. The gate is a polyside structure in which a polycrystalline silicon 105 doped with impurities and a silicide 107 are layered. The insulation film 109 acts to cap the gate. The source/drain region is formed on substrate 101 between the gate patterns. A landing pad 113 for connecting to the bit line is formed in the gap between the gates of the transistors using conventional photolithography.

Thereafter, BPSG (borophosphorus silica glass) or USG (undoped silica glass) is deposited on the whole surface of the resultant structure to form first interlayer insulation film 115. The first interlayer insulation film preferably has a thickness of approximately 1,000–4,000 Å and coats the gate of the transistor and the landing pad 113.

Figure 2B:
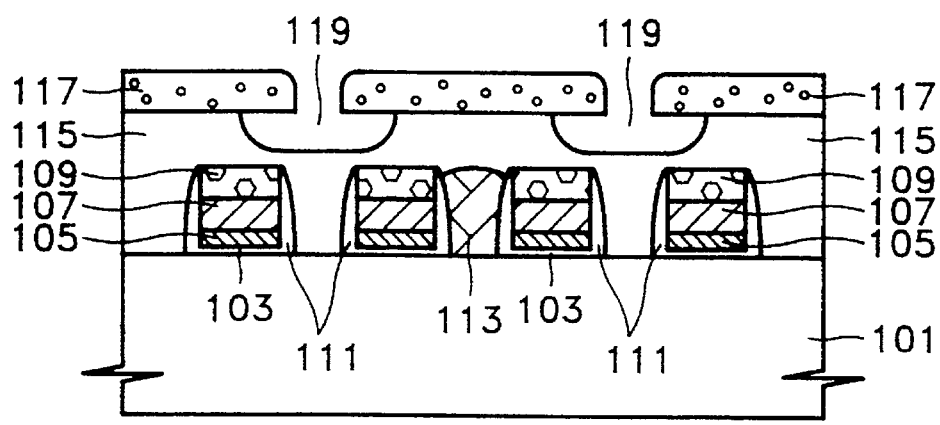

FIG. 2B shows the etching process of the first step of manufacturing a landing pad for a trophy-shaped storage electrode. A predetermined photosensitive film pattern 117 is used as a mask to isotopically etch the first interlayer insulation film 115 by a wet etching method using an etchant such as a buffered oxide etchant (BOE). After carrying out the isotropic etching process of the first step, the etching profile has a tapered hemisphere shape 119 with a horizontal length greater than a vertical length, as shown in FIG. 2B. For example, when first interlayer insulation film 115 exposed by photosensitive film pattern 117 is wet-etched by a depth of about 500–1,500 Å, tapered hemisphere 119 with a diameter about 2,500–4,000 Å is preferably obtained.

The etching process of the first step can also be carried out by using a dry etching method. In the case of the dry etching method, the process condition is controlled to make the gradient of the contact hole's side wall as gentle as possible. In this case the opening preferably has a diameter of about 2,500–4,000 Å.

Figure 2C:
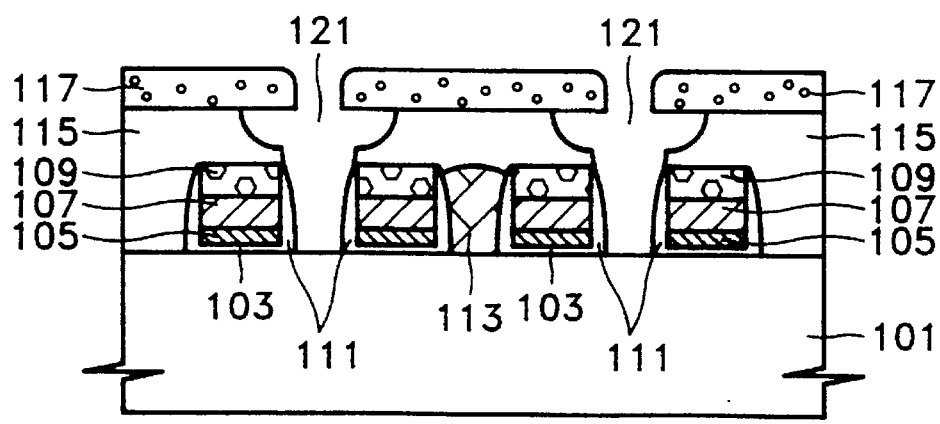

FIG. 2C shows a second step for forming a trophy-shaped contact hole 121 by using the anisotropic process of the preferred embodiment. The photosensitive film pattern 117 is used to remove the remaining first interlayer insulation film 115, preferably by an anisotropic etching process using a dry etching method, thereby forming trophy-shaped contact hole 121.

It is possible to prevent the contact hole from not opening perfectly, which is caused by the discontinuance of the etching process, by diminishing the aspect ratio of the multiple-step etching process. Also, the fact that the diameter of the upper part of contact hole 121 becomes broader by the wet etching process of the first step improves the alignment margin of the etching process.

Figure 2D:
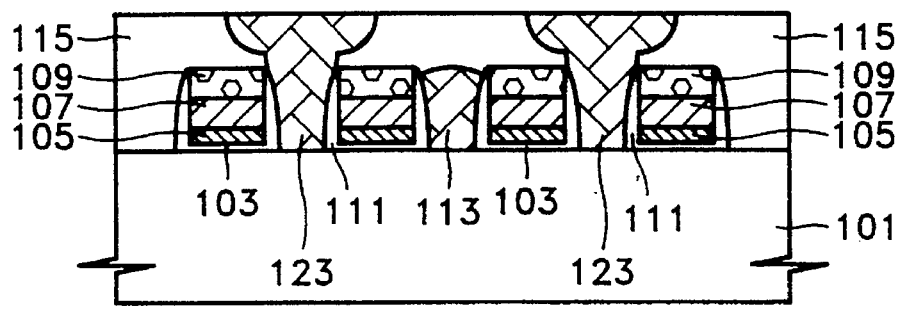

FIG. 2D shows a step for filling contact hole 121 with first conductive material to form a landing pad 123 for a trophy-shaped storage electrode. After removing the photosensitive film pattern 117, the first conductive material is deposited such that contact hole 121 is filled. Preferably, the first conductive material comprises doped polycrystalline silicon or tungsten. An etch back process using first interlayer insulation film 115 as an etching stopper or a chemical mechanical polishing process using first interlayer insulation film 115 as a polishing stopper is then carried out to make sure that the contact hole 121 is not overfilled with the doped polycrystalline silicon. The combination of the filling step and the etching/polishing step results in the creation of a trophy-shaped landing pad 123 for the storage electrode.

At this time, since the landing pad 123 for the storage electrode and the landing pad 113 for the bit line have different profiles and are formed via different etching processes, the occurrence of stringer or bridge phenomena occurring between the two can be prevented.

Figure 2E:
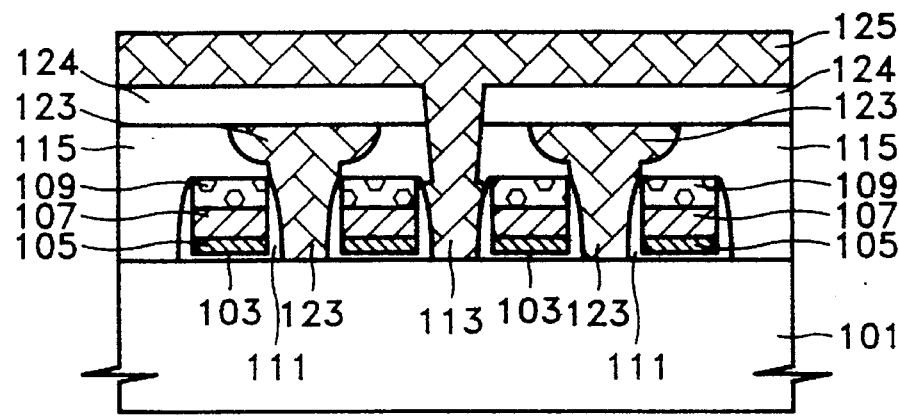

FIG. 2E shows a step for forming a bit line 125 according to a preferred embodiment of the invention. After depositing the BPSG or USG as a second interlayer insulation film on the whole surface of the resultant structure 124, preferably in a thickness of about 1,000–3,000 Å, a bit line 125 connecting to landing pad 113 for the bit line is formed. The bit line 125 is formed by passing through the first and second interlayer insulation films 115 and 124. The bit line 125 is made up of two-layered polyside in which polycrystalline and silicide are layered.

Figure 2F:
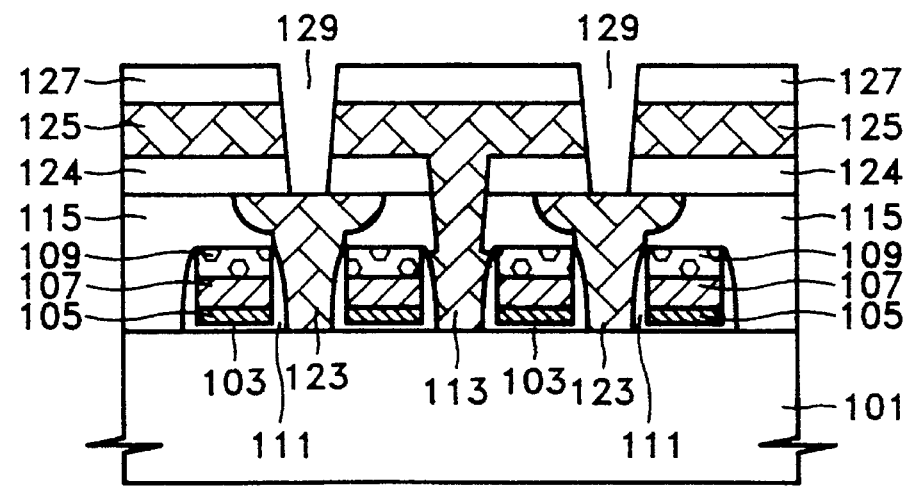

FIG. 2F shows a step for forming contact hole 129 for the storage electrode according to a preferred embodiment of the present invention. The BPSG, preferably having a thickness of about 1,000–3,000 Å, is deposited on the whole surface of bit line 125 to form a third interlayer insulation film 127. Thereafter, second and third interlayer insulation films 124 and 127 are dry-etched so that a portion of landing pad 123 for the storage node is exposed, thereby forming contact hole 129. Since the etching process is performed before the surface of landing pad 123 for the storage node is exposed, the step for forming the BC is stably carried out. Thus, landing pad 123 for the storage electrode functions to improve the aspect ratio. Also, the fact that the upper part of the trophy-shaped landing pad 123 for the storage electrode has a large diameter improves the alignment margin of the etching process.

Figure 2G:
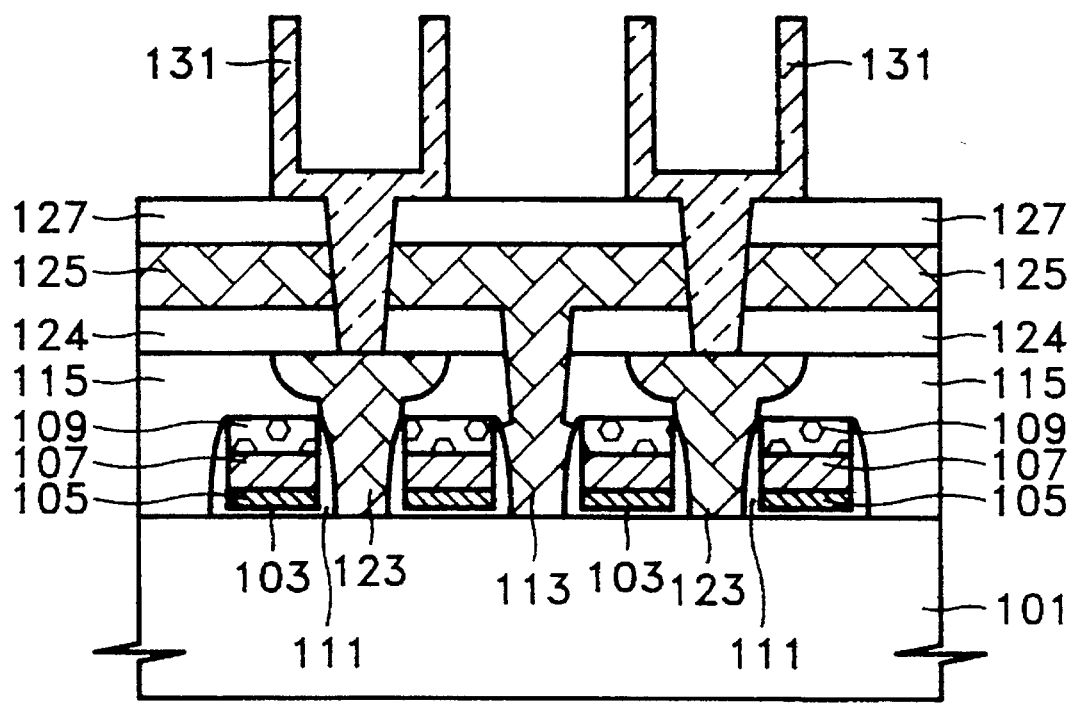

FIG. 2G shows a step for forming a storage electrode 131. After depositing a second conductive film, the storage electrode pattern is formed via the conventional photolithography.

The remaining processes, such as a process for depositing a dielectric film, a process for forming a plate electrode, and a wiring process, are the same as the conventional method for manufacturing semiconductor device.

According to the present invention as described above, the landing pad for the storage node and the landing pad for the bit line are formed in different profiles by different etching processes. This prevents the occurrence of stringer or bridge phenomena. Moreover, the trophy-shaped landing pad is formed by a multiple-step etching process, thus securing a better alignment margin and stably forming a BC without discontinuance of the etching process by lowering aspect ratio. As a consequence, the manufacturing method of the present invention is useful for manufacturing a 1 Gbit-grade DRAM.

The present invention is not limited to a specific examples described above. It should be understood that those of ordinary skill in the art will contemplate many variations and modifications to the foregoing examples that fall within the scope of the present invention as set forth in the attached claims.

What is claimed is:

1. A method for manufacturing a semiconductor device having a landing pad for a storage electrode including the steps of:

forming a first interlayer insulation film over a semiconductor substrate on which a transistor and a bit line landing pad are formed, the first interlayer insulation film covering the bit line landing pad and a gate of the transistor;

sequentially etching the first interlayer insulation film to form a contact hole in the first interlayer insulation film using an isotropic wet etching method and using an anisotropic dry etching method;

filling the contact hole with a first conductive material to form the storage electrode landing pad for connecting the storage electrode to a source/drain region of the transistor;

planarizing the first conductive material using the first interlayer insulation film as a planarizing stopper to leave only the storage electrode landing pad in the contact hole;

forming a bit line connected to the bit line landing pad; and forming the storage electrode connected to the storage electrode landing pad.

2. A method for manufacturing a semiconductor device as claimed in claim 1, wherein etching profiles by the isotropic etching process have a tapered hemispherical shape with a depth of about 500–1,500 Å and a diameter of about 2,500–4,000 Å.

3. A method for manufacturing a semiconductor device as claimed in claim 1, wherein the first conductive material is selected from the group consisting of doped polycrystalline and tungsten.

4. A method for manufacturing a semiconductor device as claimed in claim 1, wherein the bit line landing pad and the storage electrode landing pad are formed at different heights by different etching methods.

5. A method for manufacturing a semiconductor device as claimed in claim 1, wherein the planarizing step is performed by an etching back method.

6. A method for manufacturing a semiconductor device as claimed in claim 1, wherein the planarizing step is performed by chemical mechanical polishing.

* * * * *